(12) United States Patent
Manning et al.

(10) Patent No.: US 10,055,285 B2
(45) Date of Patent: Aug. 21, 2018

(54) PHYSICAL PAGE, LOGICAL PAGE, AND CODEWORD CORRESPONDENCE

(71) Applicant: Micron Technology, Inc., Boise, ID (US)

(72) Inventors: Troy A. Manning, Meridian, ID (US); Troy D. Larsen, Meridian, ID (US); Martin L. Culley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 14/681,564

(22) Filed: Apr. 8, 2015

(65) Prior Publication Data

US 2015/0212882 A1 Jul. 30, 2015

Related U.S. Application Data

(62) Division of application No. 13/421,088, filed on Mar. 15, 2012, now Pat. No. 9,026,887.

(51) Int. Cl.
*G06F 11/10* (2006.01)
*G06F 3/06* (2006.01)
(Continued)

(52) U.S. Cl.
CPC ........ *G06F 11/1068* (2013.01); *G06F 3/0619* (2013.01); *G06F 3/0688* (2013.01);
(Continued)

(58) Field of Classification Search
CPC .. G06F 11/1068; G06F 3/0619; G06F 3/0688; G06F 3/0689; G06F 11/108; G06F 3/064; G06F 3/061; G06F 3/0679; G06F 8/44; G06F 2211/104; G06F 11/1044; G06F 11/1072; G11C 29/52; G11C 11/5628; G11C 11/5642; G11C 2211/5641
(Continued)

(56) References Cited

U.S. PATENT DOCUMENTS 5,611,064 A 3/1997 Maund et al.
8,020,060 B2 9/2011 Murin
(Continued)

FOREIGN PATENT DOCUMENTS

CN 101676882 3/2010
CN 101999116 3/2011
(Continued)

OTHER PUBLICATIONS

Notice of Rejection for related Korea Patent Application No. 10-2014-7028217, dated Aug. 12, 2015, 16 pages.
(Continued)

*Primary Examiner* — James C Kerveros
(74) *Attorney, Agent, or Firm* — Brooks, Cameron & Huebsch, PLLC (57) ABSTRACT

The present disclosure includes apparatuses and methods for physical page, logical page, and codeword correspondence. A number of methods include error coding a number of logical pages of data as a number of codewords and writing the number of codewords to a number of physical pages of memory. The number of logical pages of data can be different than the number of physical pages of memory.

22 Claims, 5 Drawing Sheets

(51) Int. Cl.
*G06F 9/45* (2006.01)
*G11C 29/52* (2006.01)
*G06F 8/41* (2018.01)

(52) U.S. Cl.
CPC .......... *G06F 3/0689* (2013.01); *G06F 11/108* (2013.01); *G11C 29/52* (2013.01); *G06F 3/061* (2013.01); *G06F 3/064* (2013.01); *G06F 3/0679* (2013.01); *G06F 8/44* (2013.01); *G06F 2211/104* (2013.01)

(58) Field of Classification Search
USPC ........................................................ 714/763
See application file for complete search history.

(56) References Cited

U.S. PATENT DOCUMENTS

| | | | |
|---|---|---|---|
| 8,254,167 B2 * | 8/2012 | Patapoutian | G11C 11/5628 365/185.03 |
| 8,406,051 B2 * | 3/2013 | Patapoutian | G11C 11/5642 365/185.03 |
| 8,473,812 B2 | 6/2013 | Ramamoorthy et al. | |
| 8,724,381 B2 | 5/2014 | Burger, Jr. et al. | |
| 2007/0180349 A1 * | 8/2007 | Jacobsen | H03M 13/1102 714/776 |
| 2008/0288715 A1 | 11/2008 | Maddali et al. | |
| 2009/0070657 A1 | 3/2009 | Litsyn et al. | |
| 2009/0241008 A1 * | 9/2009 | Kim | G06F 11/1072 714/755 |
| 2010/0030999 A1 | 2/2010 | Hinz | |
| 2010/0070733 A1 | 3/2010 | Ng et al. | |
| 2010/0070735 A1 | 3/2010 | Chen et al. | |
| 2010/0082886 A1 | 4/2010 | Kwon et al. | |
| 2011/0066793 A1 | 3/2011 | Burd | |
| 2011/0078496 A1 | 3/2011 | Jeddeloh | |
| 2011/0209028 A1 | 8/2011 | Post et al. | |
| 2011/0280068 A1 | 10/2011 | Patapoutian et al. | |
| 2011/0280069 A1 * | 11/2011 | Patapoutian | G11C 11/5642 365/185.03 |

FOREIGN PATENT DOCUMENTS

| | | |
|---|---|---|
| JP | 2009524176 | 6/2009 |
| JP | 2010527484 | 8/2010 |
| JP | 2011522301 | 7/2011 |
| WO | 2009114618 | 9/2009 |
| WO | 2010033455 | 3/2010 |
| WO | 2011146355 | 11/2011 |
| WO | 2012056491 | 5/2012 |

OTHER PUBLICATIONS

Office Action for related Taiwan Patent Application No. 102109362, dated Apr. 7, 2015, 9 pages.
Notice of Rejection for related Japan Patent Application No. 2015-500482, dated Jun. 12, 2016, 4 pages.
Notice of Rejection for related Japan Patent Office Application No. 2015-500482, dated Nov. 10, 2015, 5 pages.
Supplementary Search Report and Opinion for related EP Patent Application No. 13762035.7, dated Dec. 8, 2015, 7 pages.
Office Action for related China Patent Application No. 201380023613.0, dated Jul. 25, 2016, 11 pages.
Hu et al. "Achieving Page-Mapping FTL Performance at Block-Mapping FTL Cost by Hiding Address Translation", 2010 IEEE 26th Symposium on Mass Storage Systems and Technologies, May 3-7, 2010, Incline Village, Nevada (12 pp.).
International Search Report and Written Opinion for related PCT Application No. PCT/US2013/029919 dated Jun. 21, 2013, (14 pages).
Communication Pursuant to Article 94(3) EPC for related EP Application No. 13762035.7, dated May 4, 2018, 6 pages.

* cited by examiner

*Fig. 6*

PHYSICAL PAGE, LOGICAL PAGE, AND CODEWORD CORRESPONDENCE

PRIORITY INFORMATION

This application is a Divisional of U.S. application Ser. No. 13/421,088, filed Mar. 15, 2012, the contents of which are incorporated herein by reference.

TECHNICAL FIELD

The present disclosure relates generally to semiconductor memory and methods, and more particularly, to apparatuses and methods for physical page, logical page, and codeword correspondence.

BACKGROUND

Memory devices are typically provided as internal, semiconductor, integrated circuits in computers or other electronic devices. There are many different types of memory including volatile and non-volatile memory. Volatile memory can require power to maintain its information (e.g., data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and/or NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can receive commands from a host in association with memory operations such as read and write operations to transfer data (e.g., between the memory devices and the host). It can be beneficial to increase the throughput associated with an SSD and/or to increase the storage capacity of SSDs, for example.

DETAILED DESCRIPTION

The present disclosure includes apparatuses and methods for physical page, logical page, and codeword correspondence. A number of methods include error coding a number of logical pages of data as a number of codewords and writing the number of codewords to a number of physical pages of memory. The number of logical pages of data can be different than the number of physical pages of memory.

Some previous approaches to page mapping included a one-to-one correspondence between logical pages of data and physical pages of memory. That is, the amount of data in one logical page of data was equal to the amount of data stored in one physical page of memory. In contrast, a number of embodiments of the present disclosure dissociate a size of a logical page of data (e.g., a host logical page size) from a size of a physical page of memory (e.g., a NAND page size). In some embodiments of the present disclosure, codewords (e.g., error correction code (ECC) codewords) can be dependent on a size of a physical page of memory, but can be independent of size of a logical page of data. Thus, flexible sizes of logical pages of data can be provided across arbitrary codeword sizes so that different host sector sizes can be mapped into an arbitrary page of memory.

A number of embodiments of the present disclosure can include a variable code rate for ECC codewords while maintaining a constant codeword size. Accordingly, some embodiments of the present disclosure can manage buffer memory in codeword payload sizes (e.g., rather than in physical page payload sizes). Enablement of RAIN stripes (e.g., including flexible stripe length) can be maintained to provide for defect protection. Firmware can be kept out of the performance path to improve speed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 222 may reference element "22" in FIG. 2, and a similar element may be referenced as 322 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
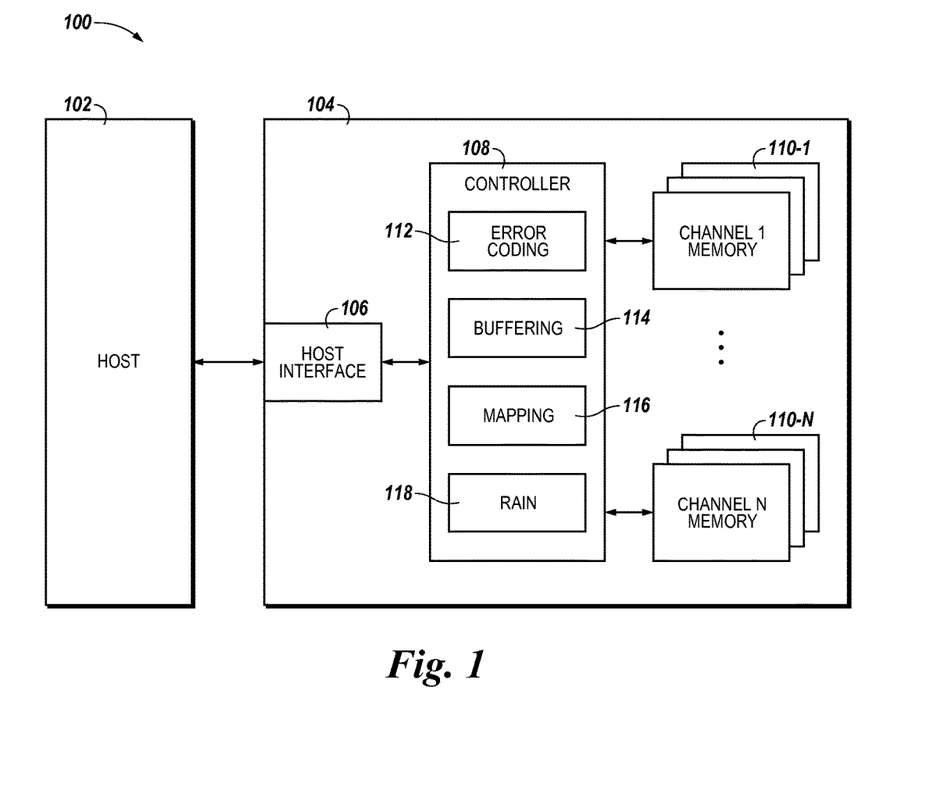
FIG. 1 is a block diagram of an apparatus in the form of a computing system including at least one memory system in accordance with a number of embodiments of the present disclosure.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as NAND flash devices), which provide a storage volume for the memory system 104.

As illustrated in FIG. 1, the controller 108 can be coupled to the host interface 106 and to the memory devices 110-1, . . . , 110-N via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory devices 110-1, . . . , 110-N to control data read, write, and erase operations, among other operations. Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., one or more integrated circuits) and/or software for controlling access to the number of memory devices 110-1, . . . , 110-N and/or for facilitating data transfer between the host 102 and memory devices 110-1, . . . , 110-N.

In some embodiments, and as illustrated in FIG. 1, the controller 108 can include an error coding component 112 (e.g., an error coder such as an error correction code (ECC) engine), a buffering component 114, a mapping component 116, and a redundant array of independent NAND (RAIN) component 118. Each of the error coding component 112, the buffering component 114, the mapping component 116, and the RAIN component 118 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the error coding component 112, the buffering component 114, the mapping component 116, and the RAIN component 118 can be external to the controller 108 or have a number of components located within the controller 108 and a number of components located external to the controller 108. For example, the buffering component can include a number of buffers located on the controller 108 and a number of buffers located external to the controller 108.

The error coding component 112 can be configured to error code a number of logical pages of data as a number of codewords. For example, the error coding component 112 can be configured to error code a non-integer number of logical pages of data as an integer number of codewords, as is described in more detail herein. The error coding component 112 can be configured to error code a logical page of data and a non-integer number of additional logical pages of data as an integer number of codewords.

A codeword can have a total size that includes a wrapper and a payload. The codeword payload can refer to the data (e.g., user data) that is encoded within the codeword. The codeword wrapper can refer to the error information that is encoded in the codeword along with the user data. The error coding component 112 can programmably use a variable codeword wrapper size and a variable codeword payload size. The variable codeword wrapper and payload sizes can be programmable as a user function (e.g., programmable via the host interface 106) or can be programmed after manufacturing for a particular application. For example, the codeword wrapper size can be programmed according to a desired amount of error correction for the codeword payload. In some embodiments, the codeword payload size can be programmed based on the particular codeword wrapper size (e.g., where a fixed and/or integer number of codewords are designed to fit within a physical page such that the total size of the codeword is fixed while the wrapper and/or payload sizes are variable). Of the total codeword size, a larger codeword wrapper provides more error protection for the codeword payload, but results in a smaller codeword payload, and thus a reduced memory density in terms of user data because the user data is then split up into smaller portions each having a larger codeword wrapper stored therewith. Once a particular codeword wrapper and/or codeword payload size have been programmed, data can be error coded as codewords having the programmed payload size.

The ratio of codeword payload size to total codeword size is referred to herein as a code rate. In some embodiments of the present disclosure, a portion of a first logical page of data can be error coded as a first codeword using a first code rate and a portion of a second logical page of data can be error coded as a second codeword using a second code rate. The size of the first and second codewords can be equal. Thus, the codeword payload size of the first codeword can be different than the codeword payload size of the second codeword. In a number of embodiments, a code rate can be set as a programmable option.

The buffering component 114 can include a plurality of physical buffers segmented into a plurality of logical buffer segments (e.g., such that a particular physical buffer is segmented into more than one logical buffer segment). Each logical buffer segment can correspond to a codeword payload size (e.g., each logical buffer segment can store as much information as is in a codeword payload). Each physical buffer can correspond to a physical page size (e.g., each physical buffer can store as much information as each physical page). A number of the plurality of physical buffers can be external to and/or internal to the controller 108. The controller 108 can be configured to communicate with a host 102 based on logical page size and to buffer manage the memory devices 110-1, . . . , 110-N based on the total codeword size.

In a number of embodiments, the controller 108 can be configured to error code a portion of a number of logical pages of data as a number of codewords by error coding the portion of the number of logical pages of data as the number of codewords each having a payload size equal to a size of each of a number of logical buffer segments. The payloads of the number of codewords can be buffered in the number of logical buffer segments prior to being written to a physical page of memory.

In a number of embodiments, the controller 108 can include a mapping component 116 and can be configured to map a plurality of logical pages of data to a plurality of corresponding physical pages of memory. A non-integer number of the plurality of logical pages of data can be mapped to each of the plurality of physical pages of memory. Additional functionality associated with the mapping component 116 is described in more detail herein, and in particular with respect to FIG. 5.

The RAIN component 118 can help protect data stored in the memory devices 110, . . . , 110-N. RAIN is an umbrella term for computer information storage schemes that divide and/or replicate information among multiple memory devices, for instance. The multiple memory devices in a RAIN array may appear to a user and the operating system of a computer as a single memory device (e.g., disk). RAIN can include striping (e.g., splitting) information so that different portions of the information are stored on different memory devices (e.g., memory devices 110, . . . , 110-N). The portions of the more than one device that store the split data are collectively referred to as a stripe. In contrast, RAIN can also include mirroring, which can include storing duplicate copies of data on more than one device. As an example, write data can be striped across N-1 of N memory devices, where error information can be stored in an Nth memory device. Error information (e.g., parity data) can be calculated by the RAIN component 118 (e.g., by XOR circuitry) and written to the Nth memory device. The RAIN component 118 can employ a flexible stripe length. The RAIN component 118 can be configured to write and/or read data in stripes across a plurality of memory devices 110-1, . . . , 110-N. For example, the controller 108 can be configured to read a stripe of data from a plurality of physical pages of memory, where each of the plurality of physical pages of memory stores a respective plurality of codewords. The controller 108 can be configured to combine payload portions of more than one of the respective plurality of codewords from one of the plurality of physical pages of memory to form a logical page of data. The logical page of data can then be transferred to a host (e.g., as a number of sectors). Additional details regarding RAIN operation are described in more detail herein, and in particular with respect to FIG. 2.

The memory devices 110-1, . . . , 110-N can include a number of arrays of memory cells (e.g., non-volatile memory cells). The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from a memory device of a memory system (e.g., memory devices 110-1, . . . , 110-N of system 104) as a physical page of data, for example. As such, a physical page of data can be referred to as a data transfer size of the memory system. Data can be transferred to/from a host (e.g., host 102) in data segments referred to as sectors (e.g., host sectors). As such, a sector of data can be referred to as a data transfer size of the host. A plurality of sectors can constitute a logical page of data.

Although a physical page of data can include a number of bytes of user data (e.g., a data payload including a number of sectors of data) as well as metadata corresponding thereto, a size of a physical page of data often can refer only to the number of bytes of the user data. As an example, a physical page of data having a page size of 4 KB may include 4 KB of user data (e.g., a 4 KB logical page of data) as well as a number of bytes (e.g., 32 B, 54 B, 224 B, etc.) of metadata corresponding to the user data. The metadata can include integrity data such as error data (e.g., error detecting and/or correcting code data) and/or address data (e.g., logical address data), among other metadata corresponding to the user data.

Figure 2:
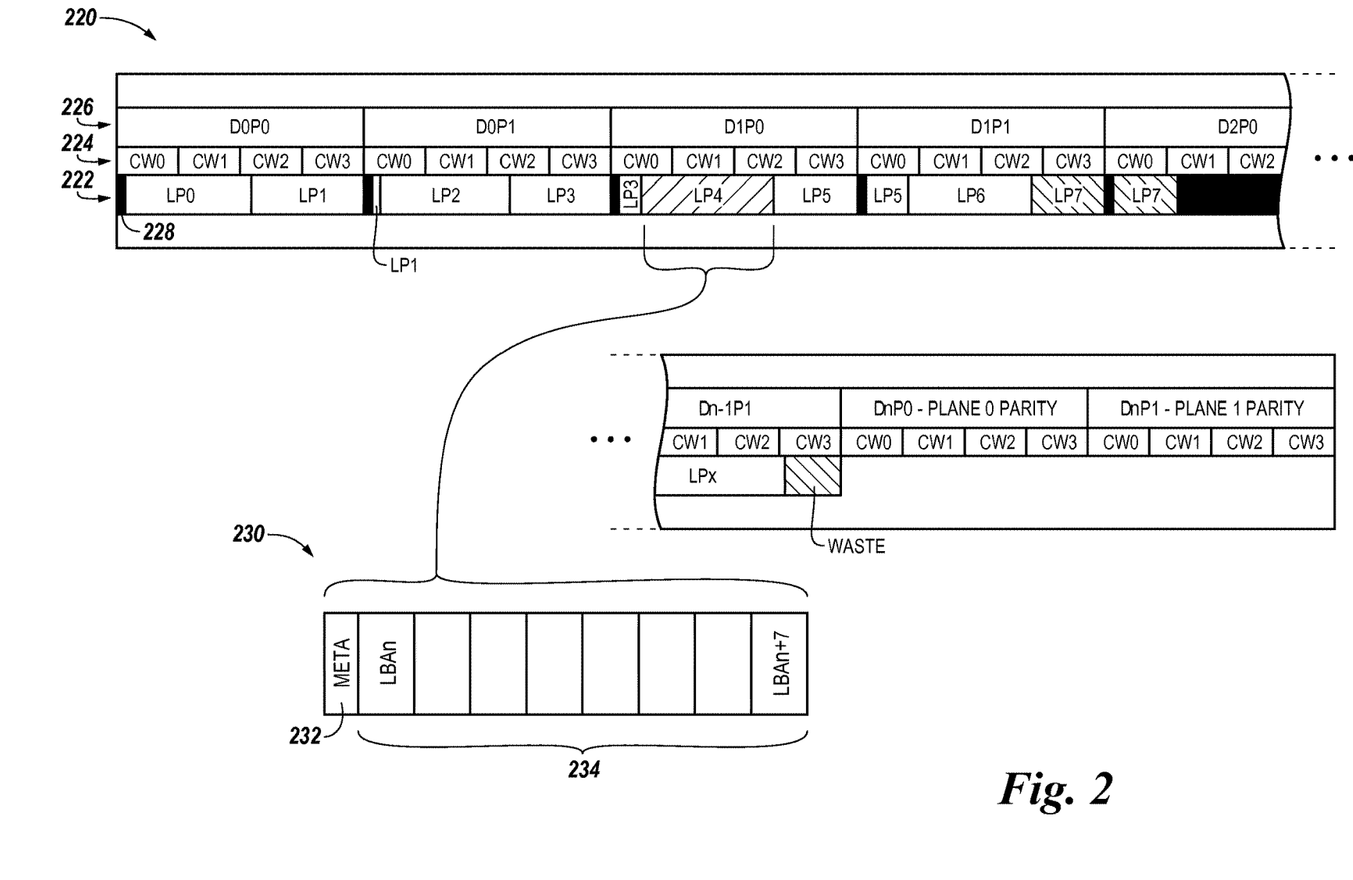
FIG. 2 is a block diagram of a page stripe layout in accordance with a number of embodiments of the present disclosure.

FIG. 2 is a block diagram of a page stripe layout 220 in accordance with a number of embodiments of the present disclosure. The page stripe layout illustrates a correlation between a number of logical pages 222, a number of codewords 224, and a number of physical pages 226, according to a number of embodiments of the present disclosure. A number of logical pages of data 222 can be error coded as a number of codewords 224. For example, physical page metadata 228, a logical page LP0, and a portion of logical page LP1 can be error coded as the codewords CW0, CW1, CW2, and CW3. The number of codewords 224 can be written to a number of physical pages of memory 226 where the number of logical pages of data 222 is different than the number of physical pages of memory 226. For example, the codewords CW0, CW1, CW2, and CW3 can be written to the physical page D0P0 (e.g., a physical page associated with die zero, plane zero). In some embodiments, the physical page metadata 228 can include a definition of the stripe (e.g., stripe length), a timestamp, an erase count, a block type, and/or more or less information. As is illustrated in FIG. 2, the physical page metadata 228 does not have a dedicated codeword, but instead, is encoded along with a portion of a logical page (e.g., CW0 includes the physical page metadata 228 and a portion of LP0).

In some embodiments, a portion of a number of logical pages of data 222 (e.g., LP0 and a portion of LP1) can be encoded as a number of codewords 224 (e.g., CW0, CW1, CW2, and CW3). The number of codewords 224 (e.g., CW0, CW1, CW2, and CW3) can be written to one physical page of memory (e.g., D0P0). The portion of the number of logical pages of data can be error coded by error coding a particular logical page of data (e.g., LP0) as a first payload portion of a first codeword (e.g., CW0) and as a second payload portion of a second codeword (e.g., CW1). A size of the first codeword (e.g., CW0) can be equal to a size of the second codeword (e.g., CW1). A size of the physical page of memory can be independent of a size of any of the number of logical pages of data 222.

As illustrated in FIG. 2, a remaining portion of the logical page LP1 can be error coded as a different codeword CW0 (e.g., along with physical page metadata and a portion of a logical page LP2) that is associated with and written to the physical page D0P1 (e.g., along with the physical page metadata, logical page LP2, and a portion of the logical page LP3). Thus, error coding a number of logical pages of data can include error coding a non-integer number of logical pages of data as an integer number of codewords. As illustrated in FIG. 2, in some embodiments, each physical page of memory can be associated with an integer number of codewords (e.g., four codewords per physical page, although embodiments are not limited to a particular number of codewords per page). An integer number of codewords can be written to an integer number of physical pages of memory. For a given stripe, the number of codewords 222 can be different than the number of logical pages of data 224 and the number of physical pages of memory 226 associated therewith.

Specific to the embodiment illustrated in FIG. 2, error coding a number of logical pages of data 222 can include error coding physical page metadata 228 and a first portion of a first logical page of data (e.g., LP0) as a first codeword (e.g., CW0), error coding a second portion of the first logical page of data (e.g., LP0) as a second codeword (e.g., CW1), error coding a third portion of the first logical page of data (e.g., LP0) and a first portion of a second logical page of data (e.g., LP1) as a third codeword (e.g., CW2), error coding a second portion of the second logical page of data (e.g., LP1) as a fourth codeword (e.g., CW3). Writing the number of codewords 224 to the number of physical pages of memory 226 can include writing the first codeword (e.g., CW0), the second codeword (e.g., CW1), the third codeword (e.g., CW2), and the fourth codeword (e.g, CW3) to a first physical page of memory (e.g, D0P0). Error coding the number of logical pages of data 222 can further include error coding physical page metadata for a second physical page, a third portion of the second logical page of data (e.g., LP1), and a first portion of a third logical page of data (e.g., LP2) as a fifth codeword (e.g., CW0 in D0P1). Among other information, the fifth codeword (e.g., CW0 in D0P1) can be written to a second physical page of memory (e.g., D0P1).

As is also illustrated in FIG. 2, the page stripe layout 220 can include a number of pages of parity data for the stripe (e.g., "DnP0—Plane 0 Parity" and "DnP1—Plane 1 Parity," although embodiments are not limited to a particular number of pages of parity data). Prior to the parity data, FIG. 2 also illustrates "Waste" data at the end of the last logical page of data (e.g., LPx). This "waste" data can be used to fill the last codeword, as the amount of data available in the number of logical pages of data may not end at a codeword boundary for the stripe according to a number of embodiments of the present disclosure because, as described herein, a non-integer number of logical pages of data can be encoded as an integer number of codewords. In some embodiments, the integer number of codewords per physical page of memory can be constant irrespective of a code rate for any of the integer number of code words.

With respect to reading operations, a stripe of data can be read from a plurality of physical pages of memory 226, where each of the physical pages of memory 226 stores a respective plurality of codewords 224, and payload portions of more than one of the respective plurality of codewords 224 from one of the physical pages of memory can be combined to form a logical page of data 222. For example, a portion of a first codeword (e.g., CW0) and a portion of a third codeword (e.g., CW2) can be combined with a second codeword (e.g., CW1), each read from a first physical page (e.g., D0P0) to form a first logical page of data (e.g., LP0). Payload portions of more than one of the respective plurality of codewords 224 from more than one of the plurality of physical pages of memory 226 can be combined to form a logical page of data 222. For example, a portion of a third codeword (e.g., CW2) and a fourth codeword (e.g., CW3) from a first physical page of memory (e.g., D0P0) can be combined with a portion of a first codeword (e.g., CW0) from a second physical page of memory (e.g., D0P1) to form a second logical page of data (e.g., LP1).

Reading a stripe of data can include reading an integer number of codewords 224. For example, an integer number of codewords 224 can be read per physical page of memory 226, per die (e.g., per D0, D1, . . . , Dn), per stripe, among others. Payload portions of the respective plurality of codewords 224 from the plurality of physical pages 226 can be combined to form a plurality of logical pages of data 222. Combining payload portions of the respective plurality of codewords 222 can include combining an entire payload portion of a first one of the respective plurality of codewords (e.g., CW3) with less than an entirety of a payload portion of a second one of the respective plurality of codewords (e.g., CW2) to form the logical page of data (e.g., LP1 associated with D0P0).

An example logical page format 230 (e.g., a format of LP4) is also illustrated in FIG. 2. The logical page format 230 can include logical page metadata 232 and a number of host sectors 234 (e.g., eight sectors per logical page; however, embodiments are not so limited). The logical page metadata 232 can include a logical block address (LBA) number, a valid sector bitmap, and a logical page type, among more or less information. The host sectors 234 can include a payload (e.g., 512-528 bytes, however embodiments are not so limited) and data path protection (DPP) information, among more or less information. In some embodiments, error information, such as cyclic code redundancy check (CRC) information can be included with the logical page format.

Among other benefits of the present disclosure, the page stripe layout described herein can enable user data compression schemes that allow for variable compression rates on a page-by-page basis, among other bases for variable compression rates. The details of such variable compression schemes are beyond the scope of the present disclosure.

Figure 3:
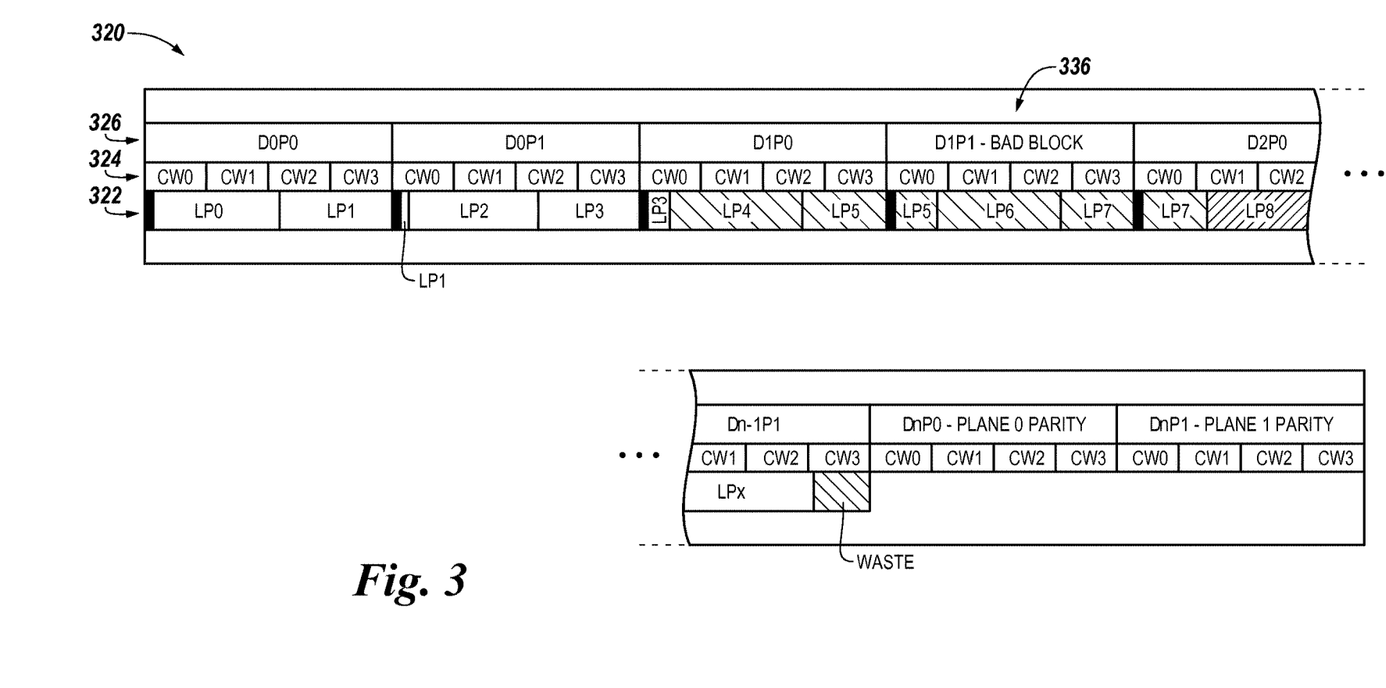
FIG. 3 is a block diagram of a page stripe layout including a known bad portion in accordance with a number of embodiments of the present disclosure.

FIG. 3 is a block diagram of a page stripe layout 320 including a known bad portion 336 in accordance with a number of embodiments of the present disclosure. With the exception of the known bad portion 336, the page stripe layout 320 can be analogous to the page stripe layout 220 illustrated in FIG. 2. That is, the page stripe layout 320 can include logical pages of data 322, codewords 324, and physical pages of data 326. A plurality of logical pages of data 322 can be mapped to a plurality of corresponding physical pages of memory 326, were a non-integer number of the plurality of logical pages 322 are mapped to each of the plurality of physical pages of memory 326.

By way of example, in FIG. 3, the known bad portion 336 can be a bad physical block of memory cells (e.g., associated with D1P1 such that the physical page associated with D1P1 is therefore also known to be bad). For those instances where the stripe layout 320 includes a known bad portion 336, the controller can be configured to skip populate a particular one of the plurality of logical pages 322 with host data at least partially in response to a particular portion 336 of the particular one of the plurality of logical pages 322 being mapped to a known bad physical page of memory (e.g., D1P1). Skip populating means that the controller can avoid populating logical pages of data 322 corresponding to the bad physical page (e.g., D1P1) with host data. The data that would otherwise be populated to those logical pages of data 322 can be populated to subsequent logical pages of data 322 (e.g., at least one subsequent logical page of data) in the page stripe layout 320.

The controller can further be configured to populate a second portion of the particular one of the plurality of logical pages of data 322 with error data, where the second portion of the particular one of the plurality of logical pages of data 322 is mapped to a known good physical page of memory. The controller can be configured to map the plurality of logical pages of data 322 to the plurality of physical pages of memory 326 in a RAIN stripe.

For example, the physical page of memory associated with D1P1 is known to be bad. The physical page of memory associated with D1P1 corresponds at least to portions of logical pages LP5, LP6, and LP7 in the original page stripe layout 320. Therefore, logical pages LP5, LP6, and LP7 can be skip populated by the controller (e.g., not populated with host data), even though only a portion of LP5 and a portion of LP7 correspond to the physical page of memory associated with D1P1. The data that otherwise would have been populated to LP5, LP6, and LP7 can be populated to subsequent logical pages (e.g., LP8, LP9, and LP10). As is illustrated in FIG. 3, a portion of LP5 and a portion of LP7 correspond to good physical pages of memory (e.g., D1P0 and D2P0). Accordingly, LP5 and LP7, or at least those portions of LP5 and LP7 corresponding to good physical pages of memory, can be populated with error data that can be used to maintain the RAIN stripe (e.g., so that parity data can be calculated and be valid for the RAIN stripe). In some embodiments, the error data populated to the skip populated logical pages, or the portions thereof corresponding to good physical pages of memory, can be randomly generated data.

Figure 4:
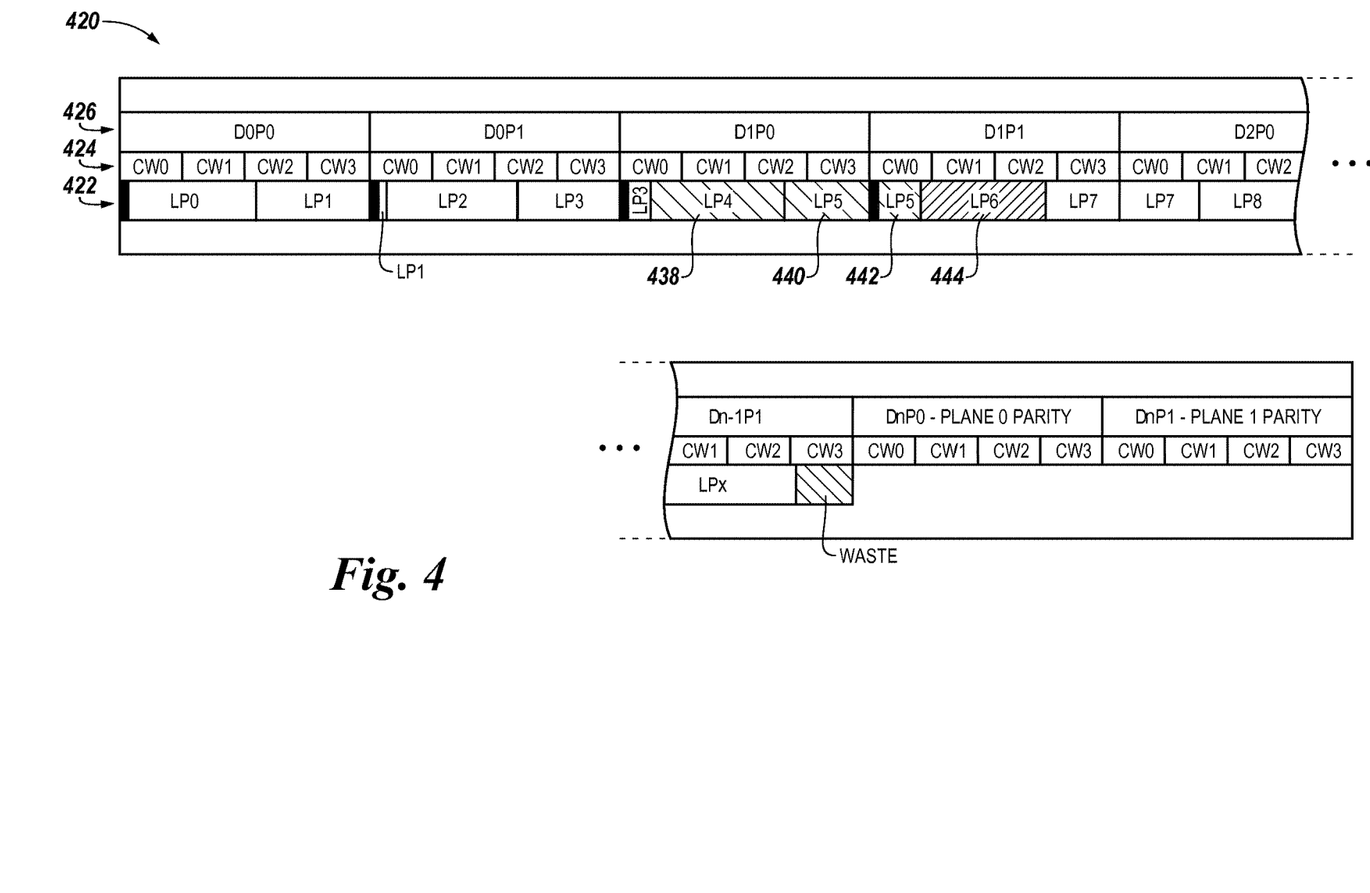
FIG. 4 is a block diagram of a page stripe layout including a forced unit access or no additional write data in accordance with a number of embodiments of the present disclosure.

FIG. 4 is a block diagram of a page stripe layout 420 including a forced unit access (FUA) or no additional write data in accordance with a number of embodiments of the present disclosure. An FUA can be indicated for a logical page of data that is to be written to the physical memory immediately (e.g., without waiting for a subsequent amount of data to be populated such that an additional physical page of memory can be programmed simultaneously). Memory operation with respect to an FUA can be analogous to a memory operation when there is no additional write data available, in some embodiments.

For example, with respect to FIG. 4, an FUA can be indicated for LP4 such that the data in LP4 is to be written to a corresponding physical page of memory (e.g., D1P0) before any data is to be populated for an additional logical page of memory (e.g., LP5). The RAIN stripe layout 420 can be maintained, however, physical pages D1P0 and D1P1 may be written during different writing operations (e.g., not simultaneously) due to the FUA.

Analogously, if there is no additional write data available after the logical page of data LP4, data in LP4 is to be written to a corresponding physical page of memory (e.g., D1P0) before any data is to be populated for an additional logical page of memory (e.g., LP5). The RAIN stripe layout 420 can be maintained; however, physical pages D1P0 and D1P1 may be written during different writing operations (e.g., not simultaneously) due to the temporary lack of additional write data, for instance.

Accordingly, in some embodiments, the controller can be configured to skip populate a particular one (e.g., LP5) of the plurality of logical pages 422 with host data at least partially in response to an FUA associated with a previous one of the plurality of logical pages of data 422 and/or no additional write data being presently available for writing. The controller can be configured to populate a first portion 440 of the particular one (e.g., LP5) of the plurality of logical pages 422 with error data (e.g., parity data for the RAIN stripe as described herein, which in some examples can be random data or other non-host data) after LP4 is populated with host data, but prior to writing data associated with the previous one (e.g., LP4) of the plurality of logical pages of data 422 in a number of the plurality of physical pages of memory 426 (e.g., physical page D1P0). As described herein, such error data can help maintain the RAIN stripe (e.g., parity data for the RAIN stripe), and such error data can include randomly generated data, for example. Other examples of the error data can include all zeros, all ones, etc.

The controller can be configured to populate a second portion 442 of the particular one (e.g., LP5) of the plurality of logical pages of data 422 with error data after the FUA and/or after additional write data becomes available. For example, the controller can be configured to resume populating valid host data in a next logical page of data (e.g., LP6) after the FUA and/or when additional write data becomes available.

Figure 5:
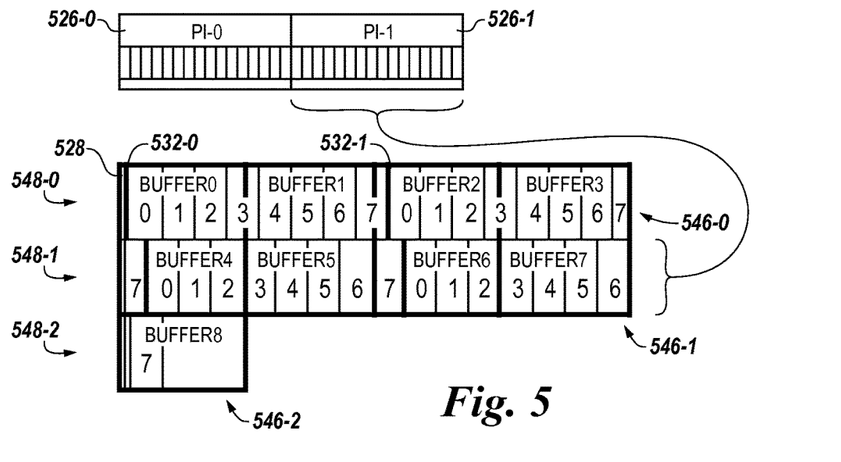
FIG. 5 is a block diagram of a buffer allocation for writing a logical page in accordance with a number of embodiments of the present disclosure.

FIG. 5 is a block diagram of a buffer allocation for writing a logical page in accordance with a number of embodiments of the present disclosure. As described herein, a physical buffer can be segregated into a number of logical buffer segments. For example, physical buffer 546-0 can be segregated into a first number of logical buffer segments 548-0 (e.g., "BUFFER0," "BUFFER1," "BUFFER2," and "BUFFER3"), physical buffer 546-1 can be segregated into a second number of logical buffer segments 548-1 (e.g., "BUFFER4," "BUFFER5," "BUFFER6," and "BUFFER7"), and physical buffer 546-2 can be segregated into a third number of logical buffer segments 548-2 (e.g., "BUFFER8"). Physical buffers can be segregated into any number of logical buffer segments and embodiments are not limited to the examples illustrated in FIG. 5. A physical buffer can have a size equal to a physical page of memory (e.g., physical buffer 546-0 can have a size equal to physical page of memory 526-0). In some embodiments, a logical buffer segment can have a size equal to a codeword payload size. For example, the amount of information bufferable in a first logical buffer segment (e.g., "BUFFER0") can be equal to a payload of an ECC codeword. The logical buffer segments can buffer data prior to error coding the data for storage in a physical page of memory. Thus, providing the logical buffer segments with a size equal to a codeword payload can help provide for a fast and efficient transfer of data between a buffering component (e.g., buffering component 114 illustrated in FIG. 1) and an error coding component (e.g., error coding component 112 illustrated in FIG. 1).

A write operation (e.g., a stripe write operation) can begin with a write request for a first logical page of data. A number of logical buffer segments sufficient to store the logical page of data can be allocated (e.g., three logical buffer segments "BUFFER0," "BUFFER1," "BUFFER2," and "BUFFER3" in this example). A portion of a first logical buffer segment (e.g., "BUFFER0") can buffer physical page of memory metadata 528 and logical page of data metadata 532-0. Locations of starting portions within the first logical buffer segment (e.g., "BUFFER0") can be mapped for each of the physical page of memory metadata 528 (e.g., position 0) and the logical page of data metadata (e.g., position 27). A location of the starting portion of the logical page of data (e.g., position 28) can be mapped (e.g., mapped to the stripe). The location of the starting portion of the logical page of data can correspond to the portion of a number of logical pages of data that are error coded as a number of codewords. The various mappings can be beneficial for reading various portions from the stripe. For example, the mapping can be used to identify the stripe that includes the starting portion of the logical page of data, and an offset can be calculated into the stripe to identify the one of the plurality of physical pages of memory and the particular codeword that includes the starting portion of the logical page of data. In a number of embodiments, an address for a logical page of data can be determined based on a set of parameters including, for example, physical page of memory total size, physical page of memory metadata size, codeword total size, codeword payload size, host sector size, and logical page metadata size.

Host sectors can be populated into a logical page of data (e.g., the logical page of data associated with the write request). The allocated logical buffer segments (e.g., "BUFFER0," "BUFFER1," "BUFFER2," and "BUFFER3") can at least partially buffer the logical page of data. In some embodiments, the controller can be configured to at least partially buffer information in the allocated logical buffer segments on a host sector by host sector basis. For example, a first host sector "0," a second host sector "1," and a third host sector "2" can be buffered in the first logical buffer segment (e.g., "BUFFER0"). A portion of a fourth host sector "3," can be buffered in the first logical buffer segment (e.g, "BUFFER0") to completely fill the first logical buffer segment. A remainder of the fourth host sector "3," can be buffed in the second logical buffer segment (e.g., "BUFFER1"). In some embodiments, a logical page of data can include eight host sectors (e.g., host sectors 0-7), however embodiments are not limited to a particular number of host sectors per logical page of data. As illustrated in FIG. 5, host sectors 4-7 can be buffered in the second logical buffer segment (e.g., "BUFFER1") and a portion of a third logical buffer segment (e.g., BUFFER2"). The controller can be configured to at least partially buffer the logical page of data in the allocated logical buffer segments such that the logical page of data fills (e.g., completely fills) all but one of the allocated logical buffer segments (e.g., where the logical page of data completely fills logical buffer segment "BUFFER0" and logical buffer segment "BUFFER1" and partially fills logical buffer segment "BUFFER2").

A subsequent logical page of data, whether part of a same write request or a subsequent write request as the first logical page of data, can have logical buffer segments allocated thereto. For example, a remainder of a third logical buffer segment (e.g., "BUFFER2") can be allocated thereto along with a fourth logical buffer segment (e.g., "BUFFER3") and a fifth logical buffer segment (e.g., "BUFFER4"). The subsequently allocated logical buffer segments can be filled beginning where the first logical page of data left off in the third logical buffer segment (e.g., "BUFFER2"), for example, after buffering logical page metadata 532-1. As illustrated in FIG. 5, the subsequent logical page of data (e.g., including subsequent host sectors 0-7) can be buffered in the third logical buffer segment (e.g., "BUFFER2") and the fourth logical buffer segment (e.g., "BUFFER3") and partially buffered a fifth logical buffer segment (e.g., "BUFFER4"). FIG. 5 also illustrates a third logical page of data (e.g., including third host sectors 0-7) being buffered in logical buffer segments (e.g., "BUFFER4," "BUFFER5," and "BUFFER6"). FIG. 5 also illustrates a fourth logical page of data (e.g., including third host sectors 0-7) being buffered in logical buffer segments (e.g., "BUFFER6," "BUFFER7," and "BUFFER8").

A logical page of data (and at least one host sector) can traverse a logical buffer boundary (e.g., a boundary between the first allocated logical buffer segment "BUFFER0" and the second allocated logical buffer segment "BUFFER1"). A link can be mapped from a first one of the allocated logical buffer segments (e.g., "BUFFER0") to a second one of the allocated logical buffer segments (e.g., "BUFFER1"). The link can be used in association with a particular host sector that traverses the logical buffer boundary between the first logical buffer segment (e.g., "BUFFER0") and the second logical buffer segment (e.g., "BUFFER1"). Furthermore, links can be mapped between subsequent logical buffer segments (e.g., between logical buffer segment "BUFFER1" and logical buffer segment "BUFFER2" etc.).

After a physical buffer (e.g., including the logical buffer segments included therein) has been filled, it can be error coded and written to a physical page of memory. For example, physical buffer 546-0 can be error coded and written to physical page of memory 526-0 and physical buffer 546-1 can be error coded and written to physical page of memory 526-1. In some embodiments, multiple physical buffers can be written to multiple physical pages of memory together (e.g., in a multi-plane write operation, and a RAIN stripe write operation, etc.).

As described herein, the memory can be buffer managed based on total codeword size by buffering a payload of a respective codeword in each of a plurality of logical buffer segments. Communications with a host can be based on logical page size by communicating a logical page of data with a host, where the logical page of data includes a respective codeword payload from each of the plurality of logical buffer segments.

Figure 6:
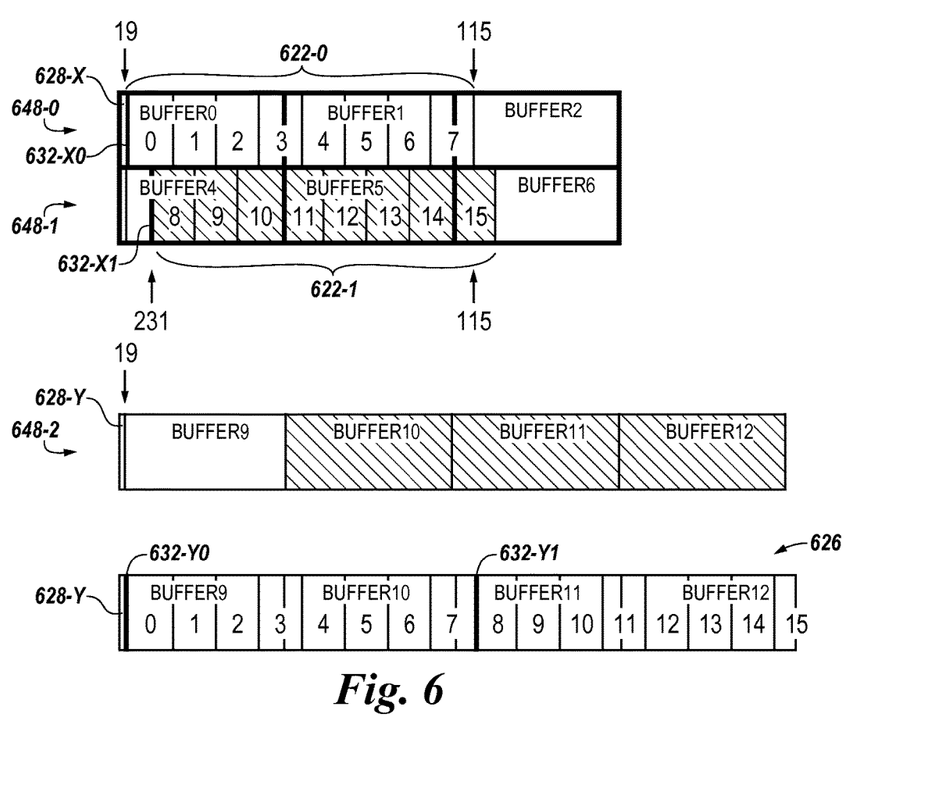
FIG. 6 is a block diagram of a buffer allocation for wear leveling in accordance with a number of embodiments of the present disclosure.

FIG. 6 is a block diagram of a buffer allocation for a wear leveling operation in accordance with a number of embodiments of the present disclosure. One example of a wear leveling operation is known as garbage collection. Garbage collection can include reclaiming (e.g., erasing and making available for writing) blocks that have the most invalid pages (e.g., according to a "greedy algorithm"). Alternatively, garbage collection can include reclaiming blocks with more than a threshold amount of invalid pages. An invalid page, for example, can be a page of data that has been updated to a different page.

For example, two logical pages of data (e.g., a first logical page of data 622-0 and a second logical page of data 622-1) may be identified for wear leveling. In this example, the first logical page of data 622-0 may include host sectors 0-7 and the second logical page of data 622-1 may include host sectors 8-15. Each logical page of data may have a corresponding number of codewords (e.g., three codewords may correspond to each logical page respectively), although an integer number of codewords can correspond to a non-integer number of logical pages of data. That is, for example, each logical page of data can have three corresponding codewords, although a particular logical page of data may not store all of the information in all three codewords. The corresponding number of codewords for the logical pages identified for wear leveling can be read and the codeword payloads can be buffered in a number of logical buffer segments allocated for the wear leveling operation (e.g., codeword payloads for the first logical page 622-0 can be buffered in a first number of logical buffer segments 648-0 and codeword payloads for the second logical page 622-1 can be buffered in a second number of logical buffer segments 648-1).

The location (e.g., location within a particular logical buffer segment) of the starting portions of each of the two logical pages of data can be known, as described herein (e.g., the logical page of data 622-0 can have a location of the starting portion at 19 after the old physical page metadata 628-X, but including the old first logical page metadata 632-X0 and the logical page of data 622-1 can have a location of the starting portion at 231 including the old second logical page of data metadata 632-X1). A third number of logical buffer segments 648-2 (e.g., "BUFFER9," "BUFFER10," "BUFFER11," and "BUFFER12"), segmented from a physical buffer, can be allocated for the wear leveling operation. Physical page metadata 628-Y for the new physical page to be written as part of the wear leveling operation can be generated and buffered in the first of the newly allocated buffer segments (e.g., "BUFFER9").

A linked list can be populated for a single page write as part of the wear leveling operation. The linked list can include an identification of the location of the first logical buffer segment (e.g., "BUFFER9" in the number of logical buffer segments 648-2) that is allocated for the wear leveling operation, a count for the physical page metadata 628-Y, a link and a count for each buffer storing the first logical page of data 622-0 and the second logical page of data 622-1. Entries in the linked list can be populated by logical buffer segment with a count for each entry and a link to a next entry (e.g., to a next logical buffer segment such as from "BUFFER0" to "BUFFER1"). The counts can identify an amount of information associated with each entry. The linked list can also include a total count for the entire list. Thus, data from the first logical page of data 622-0 and the second logical page of data 622-1 can be moved to logical buffer segments 648-2 (e.g., buffers 9-12). Subsequently, logical buffer segments 648-2 (e.g., buffers 9-12) can be written to the physical page of memory 626.

After the first logical page of data 622-0 and the second logical page of data 622-1 are buffered in the logical buffer segments 648-2, a portion of the first logical page of data 622-0 and the second logical page of data 622-1 can be written to a physical page of memory 626. For example, the portion of the first logical page of data 622-0 and the second logical page of data 622-1 written to the physical page of memory 626 can include first logical page metadata 632-Y0, second logical page metadata 632-Y1, all of host sectors 0-14 and a portion of host sector 15. A remainder of host sector 15 can be written to a new physical page of memory prior to updating an entry in a table of logical-to-physical addresses (e.g., LBA table) for the second logical page of data 622-1.

CONCLUSION

The present disclosure includes apparatuses and methods for physical page, logical page, and codeword correspondence. A number of methods include error coding a number of logical pages of data as a number of codewords and writing the number of codewords to a number of physical pages of memory. The number of logical pages of data can be different than the number of physical pages of memory.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a number of memory devices; and
    a controller coupled to the number of memory devices and configured to:
        communicate with a host based on host logical page size;
        error code a portion of a first host logical page of data into a first codeword using a first code rate, wherein the portion of the first host logical page of data comprises less than all bits of the first host logical page of data;
        error code a portion of a second host logical page of data into a second codeword using a second code rate, wherein a size of the first codeword is equal to a size of the second codeword, and wherein the portion of the second host logical page of data comprises less than all bits of the second host logical page of data; and
        write a quantity of codewords to a physical page of memory, wherein the quantity of codewords correspond to a non-integer quantity of host logical pages of data.

2. The apparatus of claim 1, wherein the quantity of codewords is constant irrespective of a code rate for any of the quantity of codewords.

3. The apparatus of claim 1, wherein a payload size of the first codeword is different than a payload size of the second codeword.

4. The apparatus of claim 1, wherein the controller is configured to receive an input to set a code rate, the code rate comprising a programmable option.

5. An apparatus, comprising:
    a number of memory devices; and
    a controller coupled to the number of memory devices and configured to:
        communicate with a host based on host logical page size;
        error code at least a respective portion of each of a plurality of host logical pages of data into a plurality of codewords, wherein the respective portions of each of the plurality of host logical pages of data comprise less than all bits of the plurality of host logical pages of data; and
        write the plurality of codewords to one physical page of memory;

wherein a size of the physical page of memory is independent of a size of any of the number of host logical pages of data.

6. The apparatus of claim 5, wherein the size of the physical page of memory is different than the size of any of the number of host logical pages of data.

7. The apparatus of claim 5, wherein the controller is further configured to map a location of a starting portion of one of the number of host logical pages of data corresponding to the portion of the number of host logical pages of data error coded as the number of codewords.

8. The apparatus of claim 5, wherein the controller is configured to error code the portion of the number of host logical pages of data as the number of codewords by error coding the portion of the number of host logical pages of data as the number of codewords each having a payload size equal to a size of each of a number of logical buffer segments.

9. The apparatus of claim 8, wherein the controller is further configured to buffer payloads of the number of codewords in the number of logical buffer segments prior to writing the number of codewords to the physical page of memory.

10. The apparatus of claim 5, wherein the controller is configured to error code the portion of the number of host logical pages of data by error coding a particular host logical page of data as a first payload portion of a first codeword and as a second payload portion of a second codeword.

11. The apparatus of claim 10, wherein a size of the first codeword is equal to a size of the second codeword.

12. A method, comprising:
error coding, via a controller, a portion of a first host logical page of data into a first codeword using a first code rate, wherein the portion of the first host logical page of data comprises less than all bits of the first host logical page of data;
wherein the controller is configured to communicate with a host based on host logical page size, and wherein the controller is coupled to a number of memory devices;
error coding, via the controller, a portion of a second host logical page of data into a second codeword using a second code rate, wherein a size of the first codeword is equal to a size of the second codeword, and wherein the portion of the second host logical page of data comprises less than all bits of the second host logical page of data; and
writing a quantity of codewords to a physical page of memory, wherein the quantity of codewords correspond to a non-integer quantity of host logical pages of data.

13. The method of claim 12, wherein the quantity of codewords is constant irrespective of a code rate for any of the quantity of codewords.

14. The method of claim 12, wherein a payload size of the first codeword is different than a payload size of the second codeword.

15. The method of claim 12, further including receive an input, via the controller, to set a code rate, the code rate comprising a programmable option.

16. A method, comprising:
error coding, via a controller, at least a respective portion of each of a plurality of host logical pages of data into a plurality of codewords, wherein the respective portions of each of the plurality of host logical pages of data comprise less than all bits of the plurality of host logical pages of data;
wherein the controller is configured to communicate with a host based on host logical page size, and wherein the controller is coupled to a number of memory devices; and
writing, via the controller, the plurality of codewords to one physical page of memory;
wherein a size of the physical page of memory is independent of a size of any of the number of host logical pages of data.

17. The method of claim 16, wherein the size of the physical page of memory is different than the size of any of the number of host logical pages of data.

18. The method of claim 16, further including mapping, via the controller, a location of a starting portion of one of the number of host logical pages of data corresponding to the portion of the number of host logical pages of data error coded as the number of codewords.

19. The method of claim 16, wherein error coding the portion of the number of host logical pages of data as the number of codewords comprises error coding the portion of the number of host logical pages of data as the number of codewords each having a payload size equal to a size of each of a number of logical buffer segments.

20. The method of claim 19, further including buffering payloads of the number of codewords in the number of logical buffer segments prior to writing the number of codewords to the physical page of memory.

21. The method of claim 16, wherein error coding the portion of the number of host logical pages of data comprises error coding a particular host logical page of data as a first payload portion of a first codeword and as a second payload portion of a second codeword.

22. The method of claim 21, wherein a size of the first codeword is equal to a size of the second codeword.

* * * * *